(12) United States Patent
Park et al.

(10) Patent No.: US 11,347,909 B1
(45) Date of Patent: May 31, 2022

(54) METHOD FOR SIMULATING GENERATION OF BLACK ICE ON ROADS AND CONTROLLING DEVICE AND SYSTEM USING THE SAME

(71) Applicant: National Institute of Meteorological Sciences, Seogwipo-si (KR)

(72) Inventors: Mi Eun Park, Gangneung-si (KR);
Hyoung Gu Nam, Gangneung-si (KR);
Geon Tae Kim, Gangneung-si (KR);
Baek Jo Kim, Gangneung-si (KR)

(73) Assignee: National Institute of Meteorological Sciences, Seogwipo-si (KR)

( * ) Notice: Subject to any disclaimer, the term of this patent is extended or adjusted under 35 U.S.C. 154(b) by 0 days.

(21) Appl. No.: 17/468,041

(22) Filed: Sep. 7, 2021

(30) Foreign Application Priority Data

Mar. 8, 2021 (KR) .......................... 10-2021-0030443

(51) Int. Cl.
*A61K 35/12* (2015.01)
*G06F 30/20* (2020.01)
*G08G 1/0967* (2006.01)

(52) U.S. Cl.
CPC ........... *G06F 30/20* (2020.01); *G08G 1/0967* (2013.01)

(58) Field of Classification Search
CPC ............................. G06G 1/0967; G06F 30/20
USPC ........................................................... 703/6
See application file for complete search history.

(56) References Cited

U.S. PATENT DOCUMENTS

2015/0166072 A1* 6/2015 Powers ..................... E01F 9/40
  701/1
2018/0005084 A1* 1/2018 Crawford ............. G07C 5/0816
2018/0086471 A1* 3/2018 Wollenweber ....... B64D 15/163

FOREIGN PATENT DOCUMENTS

CN        205679553        11/2016

OTHER PUBLICATIONS

Office Action with English Translation relating to copending Korean Application No. KR 10-2021-0030443; dated May 12, 2021.
Notice of Allowance with English Translation relating to copending Korean Application No. KR 10-2021-0030443 dated May 27, 2021.

(Continued)

*Primary Examiner* — Tai T Nguyen
(74) *Attorney, Agent, or Firm* — David R. Stevens; Stevens Law Group

(57) ABSTRACT

A method, controlling device, and system for simulating a generation of black ice on a road including steps of: (a) in response to an ambient atmosphere being determined as in a (1-1)-st state, changing the ambient atmosphere to be in a (1-2)-nd state by referring to a (1-1)-st simulation variable corresponding to a temperature of the ambient atmosphere and a (1-2)-nd simulation variable corresponding to a humidity of the ambient atmosphere; and (ii) in response to a road specimen being determined as in a (2-1)-st state, changing the road specimen to be in a (2-2)-nd state by referring to a (2-1)-st simulation variable corresponding to a temperature of the road specimen and a (2-2)-nd simulation variable corresponding to a residual precipitation; (b) applying a triggering action; and (c) determining whether the black ice is generated on the road specimen.

20 Claims, 3 Drawing Sheets

(56) References Cited

OTHER PUBLICATIONS

A study on road ice prediction by applying road freezing evaluation model Hee-Seob Lim and Sang Tae Kim, Journal of the Korean Applied Science and Technology, vol. 37, No. 6. Dec. 2020. 1507~1516.
Current status of research and future plans for development of black ice prediction technology Kim Baek Jo et al. Proceedings of the Korean Society of Environmental Sciences Society Conference, 2020, 59-59.

\* cited by examiner

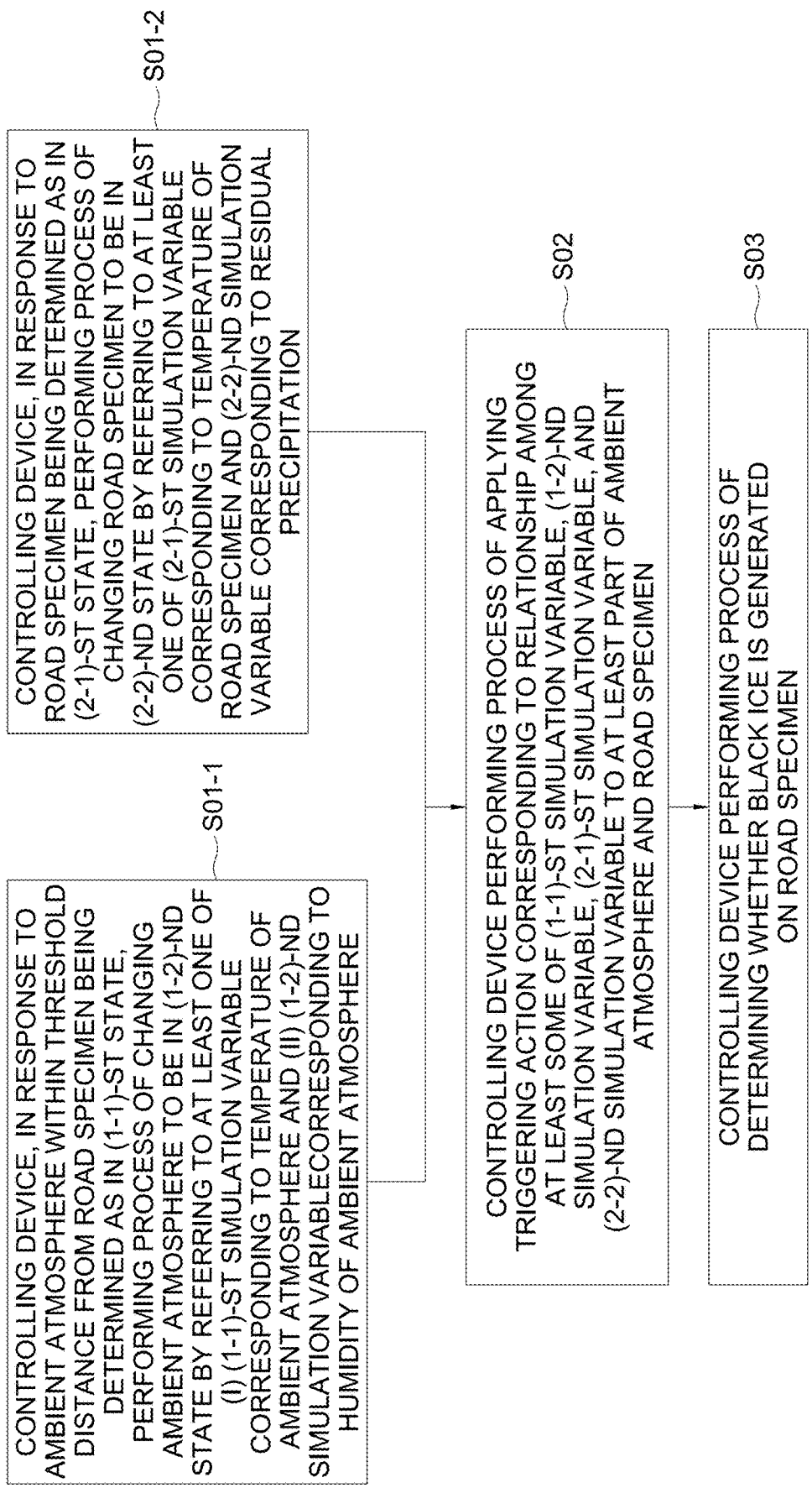

METHOD FOR SIMULATING GENERATION OF BLACK ICE ON ROADS AND CONTROLLING DEVICE AND SYSTEM USING THE SAME

CROSS-REFERENCE TO RELATED APPLICATIONS

This application claims the benefit of Korean Patent Application No. KR 10-2021-0030443, filed on Mar. 8, 2021, which is incorporated herein by reference in its entirety.

FIELD OF THE DISCLOSURE

The present disclosure relates to a method and a device for simulating a generation of black ice on roads.

BACKGROUND OF THE DISCLOSURE

Black ice refers to the formation of clear and thin ice on roads. It has recently been spotlighted for being the cause of many traffic accidents. Although countermeasures are needed to prevent such black ice that considerably increases risks of traffic accidents, so far, little is known on exactly under what circumstances and through what atmospheric changes the black ice occurs. In order to understand the occurrences of the black ice, a black ice generation predicting model that utilizes detailed data about meteorological environment is necessary, but there seems to be a lack of related researches.

SUMMARY OF THE DISCLOSURE

It is an object of the present disclosure to solve all of the aforementioned problems.

It is another object of the present disclosure to provide a simulation method and a controlling device that enable a development of a black ice generation predicting model for providing drivers and road managers with information on occurrences of black ice in advance in order to prevent traffic accidents caused by the black ice.

It is still another object of the present disclosure to provide a system which can derive accurate experimental results by mounting a road specimen on a supporting structure and installing a moisture barrier film on an upper part in an experimental space.

In order to accomplish the objects above, distinctive structures of the present disclosure are described as follows.

In accordance with one aspect of the present disclosure, there is provided a method for simulating a generation of black ice on a road including steps of: (a) a controlling device, (i) in response to an ambient atmosphere within a threshold distance from a road specimen being determined as in a (1-1)-st state, performing a process of changing the ambient atmosphere to be in a (1-2)-nd state by referring to at least one of a (1-1)-st simulation variable corresponding to a temperature of the ambient atmosphere and a (1-2)-nd simulation variable corresponding to a humidity of the ambient atmosphere; and (ii) in response to the road specimen being determined as in a (2-1)-st state, performing a process of changing the road specimen to be in a (2-2)-nd state by referring to at least one of a (2-1)-st simulation variable corresponding to a temperature of the road specimen and a (2-2)-nd simulation variable corresponding to a residual precipitation; (b) the controlling device performing a process of applying a triggering action corresponding to a relationship among at least some of the (1-1)-st simulation variable, the (1-2)-nd simulation variable, the (2-1)-st simulation variable, and the (2-2)-nd simulation variable to at least part of the ambient atmosphere and the road specimen; and (c) the controlling device performing a process of determining whether the black ice is generated on the road specimen.

As one example, at the step of (a), the controlling device, according to a first scenario inputted by an administrator, (i) sets the (1-1)-st simulation variable to be a first threshold temperature which is within a lower temperature threshold range, (ii) sets the (1-2)-nd simulation variable to be a first threshold humidity which is within an upper humidity threshold range, (iii) sets the (2-1)-st simulation variable to be a second threshold temperature corresponding to the first threshold temperature within the lower temperature threshold range, and (iv) sets the (2-2)-nd simulation variable to be a first variable which represents that the residual precipitation is equal to or less than a threshold, and wherein, at the step of (b), the controlling device, according to the first scenario, applies the triggering action by setting the (1-1)-st simulation variable to be a third threshold temperature corresponding to the first threshold temperature while preserving the (2-1)-st simulation variable and then by allowing a pseudo-precipitation phenomenon to happen.

As one example, in response to a change in the (1-1)-st simulation variable from the first threshold temperature to a third threshold temperature, (i) the controlling device changes the (1-1)-st simulation variable to be a K-th stable temperature which is among a first stable temperature to an N-th stable temperature, and wherein the first stable temperature is higher than the first threshold temperature, the N-th stable temperature is lower than the third threshold temperature, and the first stable temperature to the N-th stable temperature are in ascending order, and (ii) after a K-th stabilization period has passed, the controlling device changes the (1-1)-st simulation variable to be a (K+1)-th stable temperature, and wherein K is an integer greater than or equal to 1 and less than or equal to N−1 and wherein N is an integer greater than or equal to 2.

As one example, at the step of (a), the controlling device, according to a second scenario inputted by an administrator, (i) sets the (1-1)-st simulation variable to be a fourth threshold temperature which is within an upper temperature threshold range, (ii) sets the (1-2)-nd simulation variable to be a first threshold humidity which is within an upper humidity threshold range, (iii) sets the (2-1)-st simulation variable to be a fifth threshold temperature corresponding to the fourth threshold temperature, and (iv) sets the (2-2)-nd simulation variable to be a second variable which represents that the residual precipitation is equal to or greater than a threshold, and wherein, at the step of (b), the controlling device, according to the second scenario, applies the triggering action by setting the (1-1)-st simulation variable to be a sixth threshold temperature which is within the lower temperature threshold range.

As one example, at the step of (a), the controlling device, according to a third scenario inputted by an administrator, (i) sets the (1-1)-st simulation variable to be a seventh threshold temperature which is within a middle temperature threshold range, (ii) sets the (1-2)-nd simulation variable to be a first threshold humidity which is within an upper humidity threshold range, (iii) sets the (2-1)-st simulation variable to be an eighth threshold temperature corresponding to the seventh threshold temperature, and (iv) sets the (2-2)-nd simulation variable to be a first variable which represents that the residual precipitation is equal to or less than a threshold, and wherein, at the step of (b), the controlling device, according to the third scenario, applies the triggering action by setting the (1-1)-st simulation variable to be a ninth threshold temperature which is within a lower temperature threshold range.

As one example, the road specimen is textured by using Tining process in case it is made of cement, wherein the road specimen is mounted on a supporting structure having a height equal to or greater than a predetermined height inside an experimenting space in which the road specimen is included, and wherein the supporting structure is made of a non-conducting material with a woven structure.

As one example, at the step of (c), the controlling device records a black ice generating condition which includes the (1-1)-st simulation variable, the (1-2)-nd simulation variable, the (2-1)-st simulation variable, the (2-2)-nd simulation variable, and the triggering action at the time when the black ice is generated on the road specimen.

As one example, the method further includes step of: (d) in response to a detection that the black ice generating condition is satisfied, the controlling device supporting a black ice detection device installed on a real road to transmit a danger alarm to drivers driving on the real road.

In accordance with another aspect of the present disclosure, there is provided a controlling device for simulating a generation of black ice on a road including: at least one memory that stores instructions; and at least one processor configured to execute the instructions to perform: (I) (i) in response to an ambient atmosphere within a threshold distance from a road specimen being determined as in a (1-1)-st state, a process of changing the ambient atmosphere to be in a (1-2)-nd state by referring to at least one of a (1-1)-st simulation variable corresponding to a temperature of the ambient atmosphere and a (1-2)-nd simulation variable corresponding to a humidity of the ambient atmosphere; and (ii) in response to the road a specimen being determined as in a (2-1)-st state, a process of changing the road specimen to be in a (2-2)-nd state by referring to at least one of a (2-1)-st simulation variable corresponding to a temperature of the road specimen and a (2-2)-nd simulation variable corresponding to a residual precipitation; and (II) a process of applying a triggering action corresponding to a relationship among at least some of the (1-1)-st simulation variable, the (1-2)-nd simulation variable, the (2-1)-st simulation variable, and the (2-2)-nd simulation variable to at least part of the ambient atmosphere and the road specimen; and (III) a process of determining whether the black ice is generated on the road specimen.

As one example, at the process (I), the processor, according to a first scenario inputted by an administrator, (i) sets the (1-1)-st simulation variable to be a first threshold temperature which is within a lower temperature threshold range, (ii) sets the (1-2)-nd simulation variable to be a first threshold humidity which is within an upper humidity threshold range, (iii) sets the (2-1)-st simulation variable to be a second threshold temperature corresponding to the first threshold temperature and is within the lower temperature threshold range, and (iv) sets the (2-2)-nd simulation variable to be a first variable which represents that the residual precipitation is equal to or less than a threshold, and wherein, at the process of (II), the processor, according to the first scenario, applies the triggering action by setting the (1-1)-st simulation variable to be a third threshold temperature corresponding to the first threshold temperature while preserving the (2-1)-st simulation variable and then by allowing a pseudo-precipitation phenomenon to happen.

As one example, in response to a change in the (1-1)-st simulation variable from the first threshold temperature to a third threshold temperature, (i) the processor changes the (1-1)-st simulation variable to be a K-th stable temperature which is among a first stable temperature to an N-th stable temperature, and wherein the first stable temperature is higher than the first threshold temperature, the N-th stable temperature is lower than the third threshold temperature, and the first stable temperature to the N-th stable temperature are in ascending order, and (ii) after a K-th stabilization period has passed, the processor changes the (1-1)-st simulation variable to be a (K+1)-th stable temperature, and wherein K is an integer greater than or equal to 1 and less than or equal to N−1 and wherein N is an integer greater than or equal to 2.

As one example, at the process of (I), the processor, according to a second scenario inputted by an administrator, (i) sets the (1-1)-st simulation variable to be a fourth threshold temperature which is within an upper temperature threshold range, (ii) sets the (1-2)-nd simulation variable to be a first threshold humidity which is within an upper humidity threshold range, (iii) sets the (2-1)-st simulation variable to be a fifth threshold temperature corresponding to the fourth threshold temperature, and (iv) sets the (2-2)-nd simulation variable to be a second variable which represents that the residual precipitation is equal to or greater than a threshold, and wherein, at the process of (II), the processor, according to the second scenario, applies the triggering action by setting the (1-1)-st simulation variable to be a sixth threshold temperature which is within the lower temperature threshold range.

As one example, at the process of (I), the processor, according to a third scenario inputted by an administrator, (i) sets the (1-1)-st simulation variable to be a seventh threshold temperature which is within a middle temperature threshold range, (ii) sets the (1-2)-nd simulation variable to be a first threshold humidity which is within an upper humidity threshold range, (iii) sets the (2-1)-st simulation variable to be an eighth threshold temperature corresponding to the seventh threshold temperature, and (iv) sets the (2-2)-nd simulation variable to be a first variable which represents that the residual precipitation is equal to or less than a threshold, and wherein, at the process of (II), the processor, according to the third scenario, applies the triggering action by setting the (1-1)-st simulation variable to be a ninth threshold temperature which is within a lower temperature threshold range.

As one example, the road specimen is textured by using Tining process in case it is made of cement, wherein the road specimen is mounted on a supporting structure having a height equal to or greater than a predetermined height inside an experimenting space in which the road specimen is included, and wherein the supporting structure is made of a non-conducting material with a woven structure.

As one example, at the process of (III), the processor records a black ice generating condition which includes the (1-1)-st simulation variable, the (1-2)-nd simulation variable, the (2-1)-st simulation variable, and the (2-2)-nd simulation variable at the time when the black ice is generated on the road specimen.

As one example, the processor further performs: (IV) in response to a detection that the black ice generating condition is satisfied, a process of supporting a black ice detection device installed on a real road to transmit a danger alarm to drivers driving on the real road.

In accordance with still yet another aspect of the present disclosure, there is provided a system including: the controlling device; the road specimen; and a moisture barrier film installed on an upper part in an experimental space which includes the ambient atmosphere, wherein the moisture barrier film prevents moistures, other than those from (i) the humidity of the ambient atmosphere, (ii) the residual precipitation of the road specimen, (iii) and moistures generated by applying the triggering action, from affecting on the road specimen.

As one example, the moisture barrier film has an arch shape for preventing moistures generated at the upper part in the experimental space from falling onto the road specimen.

As one example, the road specimen includes a first contact temperature sensor to an M-th contact temperature sensor, to thereby allow a determination on whether temperatures of a first point to an M-th point on a surface of the road specimen is changing identically, and wherein, M is an integer greater than or equal to 2.

BRIEF DESCRIPTION OF THE DRAWINGS

The following drawings to be used to explain example embodiments of the present disclosure are only part of example embodiments of the present disclosure and other drawings can be obtained based on the drawings by those skilled in the art of the present disclosure without inventive work.

FIG. 3 is a flowchart illustrating the method for simulating the generation of the black ice on the roads in accordance with one example embodiment of the present disclosure.

DETAILED DESCRIPTION OF THE PREFERRED EMBODIMENTS

Figure 1:
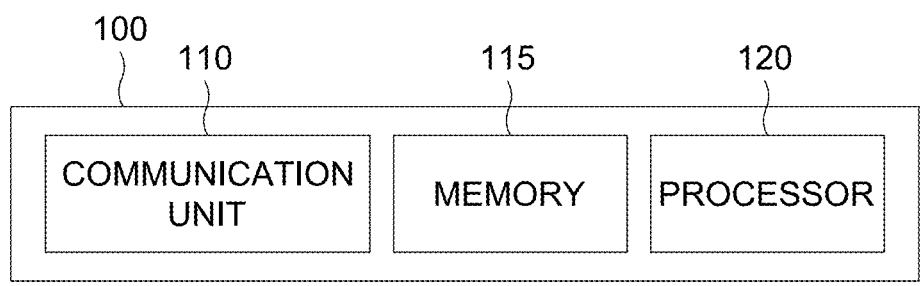
FIG. 1 is a diagram illustrating a configuration of a controlling device for simulating a generation of black ice on roads in accordance with one example embodiment of the present disclosure.

Detailed explanation on the present disclosure to be made below refer to attached drawings and diagrams illustrated as specific embodiment examples under which the present disclosure may be implemented to make clear of purposes, technical solutions, and advantages of the present disclosure. These embodiments are described in sufficient detail to enable those skilled in the art to practice the invention.

Besides, in the detailed description and claims of the present disclosure, a term "include" and its variations are not intended to exclude other technical features, additions, components or steps. Other objects, benefits and features of the present disclosure will be revealed to one skilled in the art, partially from the specification and partially from the implementation of the present disclosure. The following examples and drawings will be provided as examples but they are not intended to limit the present disclosure.

Moreover, the present disclosure covers all possible combinations of example embodiments indicated in this specification. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, similar reference numerals refer to the same or similar functionality throughout the several aspects. As used in this specification and the appended claims, the singular forms "a," "an," and "the" include plural referents unless the content and context clearly dictates otherwise.

To allow those skilled in the art to carry out the present disclosure easily, the example embodiments of the present disclosure by referring to attached diagrams will be explained in detail as shown below.

FIG. 1 is a diagram illustrating a configuration of a controlling device for simulating a generation of black ice on roads in accordance with one example embodiment of the present disclosure.

Referring to FIG. 1, an environment controlling device 100 may include a communication unit 110 and a processor 120. Receiving input/transmitting output and arithmetic operations of the environment controlling device 100 may be performed by the communication unit 110 and the processor 120, respectively. However, the detail relationship as to how the communication unit 110 and the processor 120 are connected is omitted in FIG. 1. Additionally, a memory 115 may store various instructions to be described hereinafter, and the processor 120 is configured to execute the various instructions stored in the memory 115 to perform processes that will be described hereinafter, to thereby carry out the present disclosure. However, such description of the environment controlling device 100 does not exclude an integrated processor including any combination of a medium, a processor, a memory, or any other computing components for implementing the present disclosure.

For convenience, hereinafter, the environment controlling device 100 of the present disclosure will simply be referred to as the controlling device 100.

Figure 2:
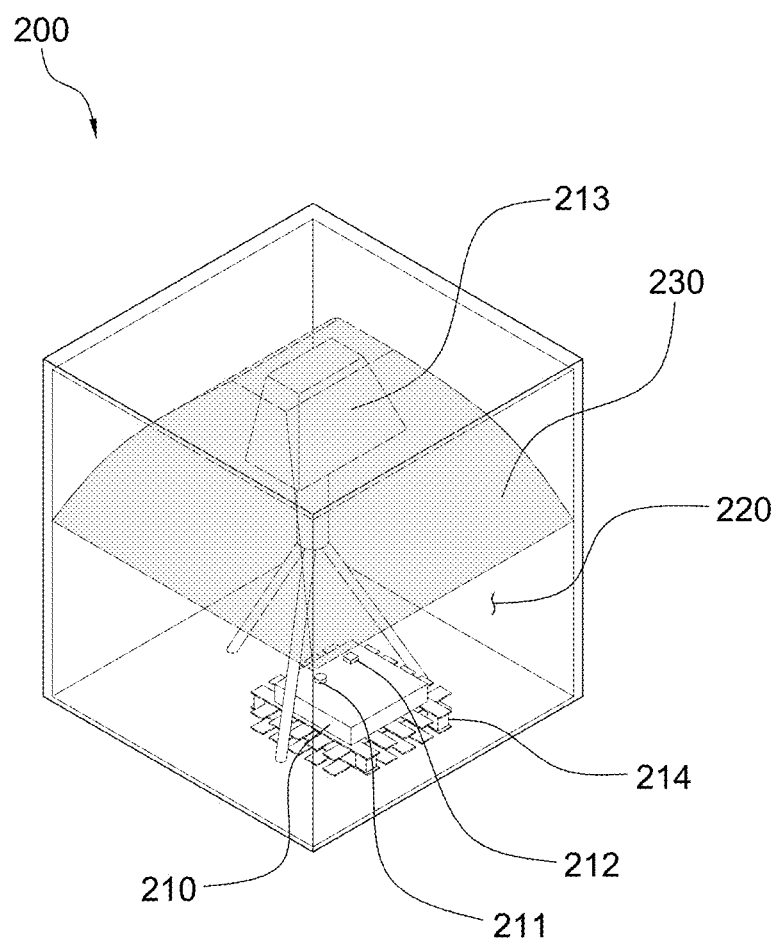
FIG. 2 is a drawing illustrating a configuration of an experimental space used for performing a method for simulating the generation of the black ice on the roads in accordance with one example embodiment of the present disclosure.

Since the configuration of the controlling device 100, in accordance with one example embodiment of the present disclosure, has been described above, an experimental space for the controlling device 100 to control an environment thereof will be described below. Reference to FIG. 2 will be made for such a purpose.

FIG. 2 is a drawing illustrating a configuration of the experimental space used for performing the method for simulating the generation of the black ice on the roads in accordance with one example embodiment of the present disclosure.

According to FIG. 2, the experimental space 200 may include a road specimen 210 and ambient atmosphere 220 thereof. The road specimen 220 is a model of a real road, and therefore, like an actual road, it may be made of cement (i.e. cement concrete) or asphalt material. In particular, it may be textured using Tining process in case it is made of cement. Further, the road specimen 210 may include a first contact temperature sensor to an M-th contact temperature sensor (where M is an integer greater than or equal to 2) on a surface of the road specimen, to thereby allow a determination on whether temperatures of a first point to an M-th point on the surface of the road specimen is changing identically. The reason for such a design, that is, to allow a measurement of temperatures of several points, is to confirm that the temperatures of all points are identical as possible within a threshold range when a temperature of the road specimen 210 is changing, as will be described later. Herein, for convenience, only the first contact temperature sensor 211 and a second contact temperature sensor 212 are illustrated. Furthermore, an optical sensor 213 installed above the road specimen 210 may be used for determining whether the black ice is generated on the road specimen. Moreover, the road specimen 210 may be mounted on a supporting structure 214, which may be made of a non-conducting material with a woven structure, as illustrated, and the height of the supporting structure 214 may be equal to or greater than a predetermined height, consequently, allowing data collected from the road specimen 210 to contain less corruptions because of heat or the like from a bottom surface of the experimental space 200. A temperature of the road specimen 210 as such may be controlled through a (2-1)-st simulation variable which will be explained later, and whether a residual precipitation remains thereon may be set through a (2-2)-nd simulation variable.

The ambient atmosphere 220, i.e., an atmosphere around the road specimen 210 included in the experimental space 200, may represent an ambient atmosphere of the real road. A temperature of the ambient atmosphere 220 may be controlled through a (1-1)-st simulation variable and a humidity of the ambient atmosphere 220 may be controlled through a (1-2)-nd simulation variable.

Additionally, the experimental space 200 may have a moisture barrier film 230 installed on an upper part therein, which can prevent moistures, other than those from (i) the humidity of the ambient atmosphere 220, (ii) the residual precipitation of the road specimen 210, (iii) and moistures generated by applying a triggering action, from affecting on the road specimen 210. That is, as illustrated, the moisture barrier film 230 may have an arch shape for preventing moistures generated at the upper part in the experimental space 200 from falling onto the road specimen 210, and instead, allow the generated moistures to fall on edges of the bottom surface of the experimental space 200.

Since the configuration of the controlling device 100 and the experimental space 200, in accordance with one example embodiment of the present disclosure, has been described above, the method for simulating the generation of the black ice on the roads will be described below in detail. Reference to FIG. 3 will be made for such a purpose.

FIG. 3 is a flowchart illustrating the method for simulating the generation of the black ice on the roads in accordance with one example embodiment of the present disclosure.

Referring to FIG. 3, the controlling device 100, (i) in response to the ambient atmosphere 220 within a threshold distance from a road specimen being determined as in a (1-1)-st state, may perform a process of changing the ambient atmosphere 220 to be in a (1-2)-nd state by referring to at least one of the (1-1)-st simulation variable corresponding to the temperature of the ambient atmosphere 220 and the (1-2)-nd simulation variable corresponding to the humidity of the ambient atmosphere 220, at a step of S01-1. Further, in parallel, the controlling device 100, in response to the road specimen 210 being determined as in a (2-1)-st state, may perform a process of changing the road specimen 210 to be in a (2-2)-nd state by referring to at least one of the (2-1)-st simulation variable corresponding to the temperature of the road specimen 210 and the (2-2)-nd simulation variable corresponding to the residual precipitation, at a step of S01-2.

Afterward, the controlling device 100 may perform a process of applying a triggering action corresponding to a relationship among at least some of the (1-1)-st simulation variable, the (1-2)-nd simulation variable, the (2-1)-st simulation variable, and the (2-2)-nd simulation variable to at least part of the ambient atmosphere 220 and the road specimen 210, at a step of S02. Thereafter, the controlling device 100 may perform a process of determining whether the black ice is generated on the road specimen 210, at a step of S03.

Hereinafter, each step will be explained in more detail.

First, at the steps of S01-1 and S01-2 of FIG. 3, a state of the ambient atmosphere 220 changes from the (1-1)-st state to the (1-2)-nd state, and a state of the road specimen 210 changes from the (2-1)-st state to the (2-2)-nd state. This represents that the state of the ambient atmosphere 220 and the state of the road specimen 210 changes respectively from the (1-1)-st state and the (1-2)-nd state, which are general states before starting an experiment, to the (1-2)-nd state and the (2-2)-nd state, which are states before the triggering action is applied. Such a change of state is made by changing simulation variables, which may be determined by at least one of a first scenario to a third scenario inputted by an administrator. Hereinafter, each scenario will be described.

First, the controlling device 100, according to the first scenario inputted by the administrator, (i) sets the (1-1)-st simulation variable to be a first threshold temperature which is within a lower temperature threshold range, (ii) sets the (1-2)-nd simulation variable to be a first threshold humidity which is within an upper humidity threshold range, (iii) sets the (2-1)-st simulation variable to be a second threshold temperature corresponding to the first threshold temperature within the lower temperature threshold range, and (iv) sets the (2-2)-nd simulation variable to be a first variable which represents that the residual precipitation is equal to or less than a threshold. Herein, the lower temperature threshold range may be a temperature range slightly below 0 degrees that can be set for the experimental space 200, and the first threshold temperature and the second threshold temperature included therein may be, for example, about 2 degrees below zero. These temperatures are mentioned to provide an example only, and the first threshold temperature and the second threshold temperature may be slightly different, also, an even lower temperature may be assumed. The upper threshold humidity range may be a highest humidity range that can be set for the experimental space 200, and the first threshold humidity included therein may be, for example, 95% or more, but it is not limited thereto.

The concept of the residual precipitation is introduced to simulate whether there are remaining moistures on the road due to rain or snow on the real road. In the first scenario, it is assumed that there is no said residual precipitation. By setting the variables above, the road specimen 210 and the ambient atmosphere 220 may be sufficiently cooled in a humid state.

Next, the controlling device 100 applies the triggering action, i.e., sets the (1-1)-st simulation variable to be a third threshold temperature corresponding to the first threshold temperature while preserving the (2-1)-st simulation variable and then allows a pseudo-precipitation phenomenon to happen. Herein, the third threshold temperature may be a temperature higher than the first threshold temperature by a preset value, for example, about 1 degree above zero. As another example, the third threshold temperature may be a temperature above zero, and the first threshold temperature may be a temperature below zero. This is to reproduce a road condition on a bridge where frequent generation of the black ice occurs since the bridge is above a ground, and cools faster than a surrounding atmosphere. Therefore, by raising the temperature of the ambient atmosphere 220 while preserving the temperature of the road specimen 210, this road condition can be reproduced. In such a case, freezing rain may be simulated. That is, precipitation falling in a form of rain may immediately turn into ice upon hitting the ground. Therefore, the controlling device 100 may induce a pseudo-precipitation phenomenon by supplying moisture in a way similar to rain on the road specimen 210. Suitable triggering actions may be applied according to relationships among the (1-1)-st simulation variable, the (1-2)-nd simulation variable, the (2-1)-nd simulation variable, and the (2-2)-nd simulation variable (further details will be described later). Herein, if the first threshold temperature to the third threshold temperature are appropriately set, the black ice may be generated. As an example, the experiment may be performed by changing the first threshold temperature to the third threshold temperature until the black ice is generated.

Herein, a detailed process for controlling the temperature of the ambient atmosphere 220 by the controlling device 100 will be described. That is, in response to a change in the (1-1)-st simulation variable from the first threshold temperature to a third threshold temperature, (i) the controlling device changes the (1-1)-st simulation variable to be a K-th stable temperature which is among a first stable temperature to an N-th stable temperature (where the first stable temperature is higher than the first threshold temperature, the N-th stable temperature is lower than the third threshold temperature, and the first stable temperature to the N-th stable temperature are in ascending order), and (ii) after a K-th stabilization period has passed, the controlling device changes the (1-1)-st simulation variable to be a (K+1)-th stable temperature. Herein, K is an integer greater than or equal to 1 and less than or equal to N−1, and N is an integer greater than or equal to 2. For example, if the first threshold temperature is 2 degrees below zero and the third threshold temperature is 1 degree above zero, the first stable temperature to a fifth stable temperature may be set as: 1.5 degrees below zero, 1 degree below zero, 0.5 degrees below zero, 0 degrees, and 0.5 degrees above zero, and while the (1-1)-st simulation variable is rising in an increment of 0.5 degrees, a first stabilization period to a fourth stabilization period may be a sufficient stabilization period of, for example, 10 minutes or more.

Following, a second scenario will be explained. That is, the controlling device, according to a second scenario inputted by the administrator, (i) sets the (1-1)-st simulation variable to be a fourth threshold temperature which is within an upper temperature threshold range, (ii) sets the (1-2)-nd simulation variable to be a first threshold humidity which is within an upper humidity threshold range, (iii) sets the (2-1)-st simulation variable to be a fifth threshold temperature corresponding to the fourth threshold temperature, and (iv) sets the (2-2)-nd simulation variable to be a second variable which represents that the residual precipitation is equal to or greater than a threshold. Herein, the fourth threshold temperature and the fifth threshold temperature may be, for example, a temperature of about 5 degrees above zero. The fourth threshold temperature and the fifth threshold temperature may be different from each other. The second is intended to reproduce a case in which the residual precipitation exceeds the threshold and there are moistures on the real road due to rain or snow.

Thereafter, the controlling device 100, according to the second scenario, applies the triggering action by setting the (1-1)-st simulation variable to be a sixth threshold temperature which is within the lower temperature threshold range. Herein, the sixth threshold temperature may a temperature below zero, for example, 5 degrees below zero. By applying such triggering action, it is possible to reproduce a case in which a temperature suddenly drops while there are moistures on the real road due to rain or snow.

Following, a third scenario will be explained. The controlling device 100, according to a third scenario inputted by the administrator, (i) sets the (1-1)-st simulation variable to be a seventh threshold temperature which is within a middle temperature threshold range, (ii) sets the (1-2)-nd simulation variable to be a first threshold humidity, e.g., the humidity of 95 percent, which is within an upper humidity threshold range, (iii) sets the (2-1)-st simulation variable to be an eighth threshold temperature corresponding to the seventh threshold temperature, and (iv) sets the (2-2)-nd simulation variable to be a first variable which represents that the residual precipitation is equal to or less than a threshold. Herein, the seventh threshold temperature and the eighth threshold temperature may be a temperature above zero, for example, 1 degree above zero. Since this case is to reproduce a case in which a temperature rapidly drops under a very high humidity, the residual precipitation may be below the threshold as in the first scenario.

Thereafter, the controlling device 100, according to the third scenario, applies the triggering action by setting the (1-1)-st simulation variable to be a ninth threshold temperature which is within a lower temperature threshold range. As described above, since the third scenario assumes a case in which the temperature rapidly drops under the very high humidity, the ninth threshold temperature may be a low temperature that is below zero, such as, 5 degrees below zero.

Following, the above-mentioned "triggering action" will be exemplarily described. In the first scenario, it is assumed that the (1-1)-st simulation variable and the (2-1)-st simulation variable remain equal but afterward the (1-1)-st simulation variable becomes higher than the (2-1)-st simulation variable, therefore, the triggering action, in this case, may mean a control action that can produce such a relationship. Further, in a case of the second scenario, it is assumed that the (1-1)-st simulation variable and the (2-1)-st simulation variable simultaneously drops to sub-zero temperatures, from a state in which the (1-1)-st simulation variable and the (2-1)-st simulation variable were both temperatures above-zero and the (2-2)-nd simulation variable represents the residual precipitation, and therefore, as will be explained later, a control action for simultaneously lowering the (1-1)-st simulation variable and the (2-1)-st simulation variable may be applied as the triggering action. Lastly, in a case of the third scenario, it also assumes that the (1-1)-st simulation variable and the (2-1)-st simulation variable simultaneously drops to sub-zero temperatures, from a state in which the (1-1)-st simulation variable and the (2-1)-st simulation variable were both temperatures above-zero in a state of high humidity and the (2-2)-nd simulation variable represents the residual precipitation, and therefore, a control action for simultaneously lowering the (1-1)-st simulation variable and the (2-1)-st simulation variable may be applied as the triggering action.

By performing these various scenarios, that is, changing the (1-1)-st simulation variable, the (1-2)-st simulation variable, the (2-1)-st simulation variable, and the (2-2)-nd simulation variable in different combinations, it is possible for the controlling device 100 to record under what condition does the black ice is generated. In other words, the controlling device 100 may record at least one black ice generating condition which is related to the (1-1)-st simulation variable, the (1-2)-nd simulation variable, the (2-1)-st simulation variable, the (2-2)-nd simulation variable, and the triggering action at the time when the black ice is generated on the road specimen. In addition, it can also record which scenario it is based on. For example, by assuming that the (1-1)-st simulation variable, the (1-2)-nd simulation variable, the (2-1)-st simulation variable, the (2-2)-nd simulation variable, the triggering action, and a scenario ID are recorded in a form of at least one vector, then when the black ice is generated based on the first scenario, a vector of (2 degrees below zero, humidity 95%, 2 degrees below zero, no residual precipitation, 3 degrees temperature increase for the temperature of the ambient atmosphere+precipitation, the first scenario) may be recorded. Alternatively, if the black ice is generated based on the second scenario, a vector of (5 degrees above zero, humidity 95%, 5 degrees above zero, has residual precipitation, 10 degrees temperature decrease for the temperature of the ambient atmosphere, the second scenario) may be recorded.

Such recorded black ice generating conditions may be used to inform drivers about potential risks of black ice, for example, in response to a detection that the black ice generating condition is satisfied, the controlling device 100 may support a black ice detection device installed on a real road to transmit a danger alarm to drivers driving on the real road. This will prevent traffic accidents, and increase safety.

The present disclosure has an effect of providing a simulation method and the controlling device that enable a development of a black ice generation predicting model capable of providing the drivers and road managers with information on generations of the black ice in advance in order to prevent traffic accidents caused by the black ice.

The present disclosure has another effect of providing a system which can derive accurate experimental results by mounting the road specimen on the supporting structure and installing the moisture barrier film on the upper part in the experimental space.

The embodiments of the present invention as explained above can be implemented in a form of executable program command through a variety of computer means recordable to computer readable media. The computer readable media may include solely or in combination, program commands, data files, and data structures. The program commands recorded to the media may be components specially designed for the present disclosure or may be usable to those skilled in the art. Computer readable media include magnetic media such as hard disk, floppy disk, and magnetic tape, optical media such as CD-ROM and DVD, magneto-optical media such as floptical disk and hardware devices such as ROM, RAM, and flash memory specially designed to store and carry out program commands. Program commands include not only a machine language code made by a complier but also a high-level code that can be used by an interpreter etc., which is executed by a computer. The aforementioned hardware device can work as more than a software module to perform the action of the present disclosure and vice versa.

As seen above, the present disclosure has been explained by specific matters such as detailed components, limited embodiments, and drawings. They have been provided only to help more general understanding of the present disclosure. It, however, will be understood by those skilled in the art that various changes and modification may be made from the description without departing from the spirit and scope of the disclosure as defined in the following claims.

Accordingly, the thought of the present disclosure must not be confined to the explained embodiments, and the following patent claims as well as everything including variations equal or equivalent to the patent claims pertain to the category of the thought of the present disclosure.

What is claimed is:

1. A method for simulating a generation of black ice on a road comprising steps of:
    (a) locating (i) a road specimen on a supporting structure, wherein the supporting structure is installed on a bottom surface of a housing, and wherein the housing defines an experimental space, (ii) a plurality of contact temperature sensors configured to measure at least one temperature of a plurality of locations in the road specimen, (iii) at least one contact humidity sensor which measures a degree of residual precipitation on the road specimen, and (iv) an optical sensor above the road specimen, wherein the optical sensor determines whether the black ice is generated on the road specimen;
    (b) a controlling device, (i) in response to an ambient atmosphere within a threshold distance from the road specimen being determined as in a (1-1)-st state, performing a process of changing the ambient atmosphere to be in a (1-2)-nd state by referring to at least one of a (1-1)-st simulation variable corresponding to a temperature of the ambient atmosphere and a (1-2)-nd simulation variable corresponding to a humidity of the ambient atmosphere; and (ii) in response to the road specimen being determined as in a (2-1)-st state, performing a process of changing the road specimen to be in a (2-2)-nd state by referring to at least one of a (2-1)-st simulation variable corresponding to the temperature of the road specimen measured by the contact temperature sensors and a (2-2)-nd simulation variable corresponding to a residual precipitation measured by the contact humidity sensor;
    (c) the controlling device performing a process of applying a triggering action corresponding to a relationship among at least some of the (1-1)-st simulation variable, the (1-2)-nd simulation variable, the (2-1)-st simulation variable, and the (2-2)-nd simulation variable to at least part of the ambient atmosphere and the road specimen; and
    (d) the controlling device allowing the optical sensor to determine whether the black ice is generated on the road specimen.

2. The method of claim 1, wherein, at the step of (b), the controlling device, according to a first scenario inputted by an administrator, (i) sets the (1-1)-st simulation variable to be a first threshold temperature which is within a lower temperature threshold range, (ii) sets the (1-2)-nd simulation variable to be a first threshold humidity which is within an upper humidity threshold range, (iii) sets the (2-1)-st simulation variable to be a second threshold temperature corresponding to the first threshold temperature within the lower temperature threshold range, and (iv) sets the (2-2)-nd simulation variable to be a first variable which represents that the residual precipitation is equal to or less than a threshold, and
    wherein, at the step of (c), the controlling device, according to the first scenario, applies the triggering action by setting the (1-1)-st simulation variable to be a third threshold temperature corresponding to the first threshold temperature while preserving the (2-1)-st simulation variable and then by allowing a pseudo-precipitation phenomenon to happen.

3. The method of claim 2, wherein, in response to a change in the (1-1)-st simulation variable from the first threshold temperature to a third threshold temperature, (i)

the controlling device changes the (1-1)-st simulation variable to be a K-th stable temperature which is among a first stable temperature to an N-th stable temperature, and wherein the first stable temperature is higher than the first threshold temperature, the N-th stable temperature is lower than the third threshold temperature, and the first stable temperature to the N-th stable temperature are in ascending order, and (ii) after a K-th stabilization period has passed, the controlling device changes the (1-1)-st simulation variable to be a (K+1)-th stable temperature, and wherein K is an integer greater than or equal to 1 and less than or equal to N−1 and wherein N is an integer greater than or equal to 2.

4. The method of claim 1, wherein, at the step of (b), the controlling device, according to a second scenario inputted by an administrator, (i) sets the (1-1)-st simulation variable to be a fourth threshold temperature which is within an upper temperature threshold range, (ii) sets the (1-2)-nd simulation variable to be a first threshold humidity which is within an upper humidity threshold range, (iii) sets the (2-1)-st simulation variable to be a fifth threshold temperature corresponding to the fourth threshold temperature, and (iv) sets the (2-2)-nd simulation variable to be a second variable which represents that the residual precipitation is equal to or greater than a threshold, and wherein, at the step of (c), the controlling device, according to the second scenario, applies the triggering action by setting the (1-1)-st simulation variable to be a sixth threshold temperature which is within the lower temperature threshold range.

5. The method of claim 1, wherein, at the step of (b), the controlling device, according to a third scenario inputted by an administrator, (i) sets the (1-1)-st simulation variable to be a seventh threshold temperature which is within a middle temperature threshold range, (ii) sets the (1-2)-nd simulation variable to be a first threshold humidity which is within an upper humidity threshold range, (iii) sets the (2-1)-st simulation variable to be an eighth threshold temperature corresponding to the seventh threshold temperature, and (iv) sets the (2-2)-nd simulation variable to be a first variable which represents that the residual precipitation is equal to or less than a threshold, and wherein, at the step of (c), the controlling device, according to the third scenario, applies the triggering action by setting the (1-1)-st simulation variable to be a ninth threshold temperature which is within a lower temperature threshold range.

6. The method of claim 1, wherein the road specimen is textured by using a Tining process in case it is made of cement, wherein the road specimen is mounted on a supporting structure having a height equal to or greater than a predetermined height inside an experimenting space in which the road specimen is included, and wherein the supporting structure is made of a non-conducting material with a woven structure.

7. The method of claim 1, wherein, at the step of (d), the controlling device records a black ice generating condition which includes the (1-1)-st simulation variable, the (1-2)-nd simulation variable, the (2-1)-st simulation variable, the (2-2)-nd simulation variable, and the triggering action at the time when the black ice is generated on the road specimen.

8. The method of claim 7, further comprising a step of: (e) in response to a detection that the black ice generating condition is satisfied, the controlling device supporting a black ice detection device installed on a real road to transmit a danger alarm to drivers driving on the real road.

9. A system for simulating a generation of black ice on a road comprising:

a housing which defines an experimental space;

a road specimen mounted on a supporting structure, wherein the supporting structure is installed on a bottom surface of the housing;

a plurality of contact temperature sensors which measure at least one temperature of a plurality of locations in the road specimen;

at least one contact humidity sensor which measures a degree of residual precipitation on the road specimen;

an optical sensor, installed above the road specimen, which determines whether the black ice is generated on the road specimen;

at least one memory that stores instructions; and at least one processor configured to execute the instructions to perform: (I) (i) in response to an ambient atmosphere within a threshold distance from the road specimen being determined as in a (1-1)-st state, a process of changing the ambient atmosphere to be in a (1-2)-nd state by referring to at least one of a (1-1)-st simulation variable corresponding to a temperature of the ambient atmosphere and a (1-2)-nd simulation variable corresponding to a humidity of the ambient atmosphere; and (ii) in response to the road specimen being determined as in a (2-1)-st state, a process of changing the road specimen to be in a (2-2)-nd state by referring to at least one of a (2-1)-st simulation variable corresponding to a temperature of the road specimen measured by the contact temperature sensors and a (2-2)-nd simulation variable corresponding to a residual precipitation measured by the contact humidity sensor; and (II) a process of applying a triggering action corresponding to a relationship among at least some of the (1-1)-st simulation variable, the (1-2)-nd simulation variable, the (2-1)-st simulation variable, and the (2-2)-nd simulation variable to at least part of the ambient atmosphere and the road specimen; and (III) a process of allowing the optical sensor to determine whether the black ice is generated on the road specimen.

10. The system of claim 9, wherein, at the process (I), the processor, according to a first scenario inputted by an administrator, (i) sets the (1-1)-st simulation variable to be a first threshold temperature which is within a lower temperature threshold range, (ii) sets the (1-2)-nd simulation variable to be a first threshold humidity which is within an upper humidity threshold range, (iii) sets the (2-1)-st simulation variable to be a second threshold temperature corresponding to the first threshold temperature and is within the lower temperature threshold range, and (iv) sets the (2-2)-nd simulation variable to be a first variable which represents that the residual precipitation is equal to or less than a threshold, and wherein, at the process of (II), the processor, according to the first scenario, applies the triggering action by setting the (1-1)-st simulation variable to be a third threshold temperature corresponding to the first threshold temperature while preserving the (2-1)-st simulation variable and then by allowing a pseudo-precipitation phenomenon to happen.

11. The system of claim 10, wherein, in response to a change in the (1-1)-st simulation variable from the first threshold temperature to a third threshold temperature, (i) the processor changes the (1-1)-st simulation variable to be a K-th stable temperature which is among a first stable temperature to an N-th stable temperature, and wherein the first stable temperature is higher than the first threshold temperature, the N-th stable temperature is lower than the third threshold temperature, and the first stable temperature to the N-th stable temperature are in ascending order, and (ii) after a K-th stabilization period has passed, the processor changes the (1-1)-st simulation variable to be a (K+1)-th stable temperature, and wherein K is an integer greater than or equal to 1 and less than or equal to N−1 and wherein N is an integer greater than or equal to 2.

12. The system of claim 9, wherein, at the process of (I), the processor, according to a second scenario inputted by an administrator, (i) sets the (1-1)-st simulation variable to be a fourth threshold temperature which is within an upper temperature threshold range, (ii) sets the (1-2)-nd simulation variable to be a first threshold humidity which is within an upper humidity threshold range, (iii) sets the (2-1)-st simulation variable to be a fifth threshold temperature corresponding to the fourth threshold temperature, and (iv) sets the (2-2)-nd simulation variable to be a second variable which represents that the residual precipitation is equal to or greater than a threshold, and wherein, at the process of (II), the processor, according to the second scenario, applies the triggering action by setting the (1-1)-st simulation variable to be a sixth threshold temperature which is within the lower temperature threshold range.

13. The system of claim 9, wherein, at the process of (I), the processor, according to a third scenario inputted by an administrator, (i) sets the (1-1)-st simulation variable to be a seventh threshold temperature which is within a middle temperature threshold range, (ii) sets the (1-2)-nd simulation variable to be a first threshold humidity which is within an upper humidity threshold range, (iii) sets the (2-1)-st simulation variable to be an eighth threshold temperature corresponding to the seventh threshold temperature, and (iv) sets the (2-2)-nd simulation variable to be a first variable which represents that the residual precipitation is equal to or less than a threshold, and wherein, at the process of (II), the processor, according to the third scenario, applies the triggering action by setting the (1-1)-st simulation variable to be a ninth threshold temperature which is within a lower temperature threshold range.

14. The system of claim 9, wherein the road specimen is textured by using Tining process in case it is made of cement, and wherein the supporting structure is made of a non-conducting material with a woven structure.

15. The system of claim 9, wherein, at the process of (III), the processor records a black ice generating condition which includes the (1-1)-st simulation variable, the (1-2)-nd simulation variable, the (2-1)-st simulation variable, and the (2-2)-nd simulation variable at the time when the black ice is generated on the road specimen.

16. The system of claim 15, wherein the processor further performs: (IV) in response to a detection that the black ice generating condition is satisfied, a process of supporting a black ice detection device installed on a real road to transmit a danger alarm to drivers driving on the real road.

17. The system of claim 9, wherein, at the process of (III), the processor determines whether the black ice is generated on the road specimen by utilizing an optical sensor installed thereon.

18. The system of claim 9, further comprising:

a moisture barrier film installed on an upper part in the experimental space which includes the ambient atmosphere, wherein the moisture barrier film prevents moistures, other than those from (i) the humidity of the ambient atmosphere, (ii) the residual precipitation of the road specimen, (iii) and moistures generated by applying the triggering action, from affecting on the road specimen.

19. The system of claim 18, wherein the moisture barrier film has an arch shape for preventing moistures generated at the upper part in the experimental space from falling onto the road specimen.

20. The system of claim 19, wherein the road specimen includes a first contact temperature sensor to an M-th contact temperature sensor, to thereby allow a determination on whether temperatures of a first point to an M-th point on a surface of the road specimen is changing identically, and wherein, M is an integer greater than or equal to 2.

\* \* \* \* \*